ived States [11] B 3,985,423
Tseng [45] Oct. 12, 1976

[54] OPTICAL DIGITAL TO ANALOG CONVERTER

[75] Inventor: Samuel Chin-Chong Tseng, Yorktown Heights, N.Y.

[73] Assignee: International Business Machines Corporation, Armonk, N.Y.

[22] Filed: Dec. 31, 1974

[21] Appl. No.: 537,722

[44] Published under the second Trial Voluntary Protest Program on February 3, 1976 as document No. B 537,722.

[52] U.S. Cl. .......................... 350/96 WG; 350/96 C
[51] Int. Cl.² ............................................ G02B 5/14
[58] Field of Search ................... 350/96 WG, 96 C

[56] References Cited
UNITED STATES PATENTS
3,830,555  8/1974  Warner .................... 350/96 WG OTHER PUBLICATIONS
Tien et al., "Switching and Modulation of Light in Magneto–optic Waveguides of Garnet Films," Appl. Phys. Lett., vol. 21, No. 8, 1972.
Tseng et al., "Mode Conversion in Magneto–Optic Waveguides Subjected to a Periodic Permalloy Structure," Appl. Phys. Lett., vol. 24, No. 6, 1974.
Lean, "Optical Switch and Modulator in Parallel Waveguides," IBM Tech. Disc. Bulletin, vol. 17, No. 4, Sept. 1974.

Primary Examiner—Alfred E. Smith
Assistant Examiner—Stewart Levy
Attorney, Agent, or Firm—Robert E. Sandt

[57] ABSTRACT

An optical digital to analog converter having a plurality of input channels, each having the presence or absence of light representing the respective ones or zeros of a digital code, each of the input channels being coupled to a channel consisting of cascaded magneto-optical mode converters, the number of cascaded elements being equal to the corresponding weighting value of the element of the code, and a common receptor to which the outputs of the cascades are coupled.

5 Claims, 4 Drawing Figures

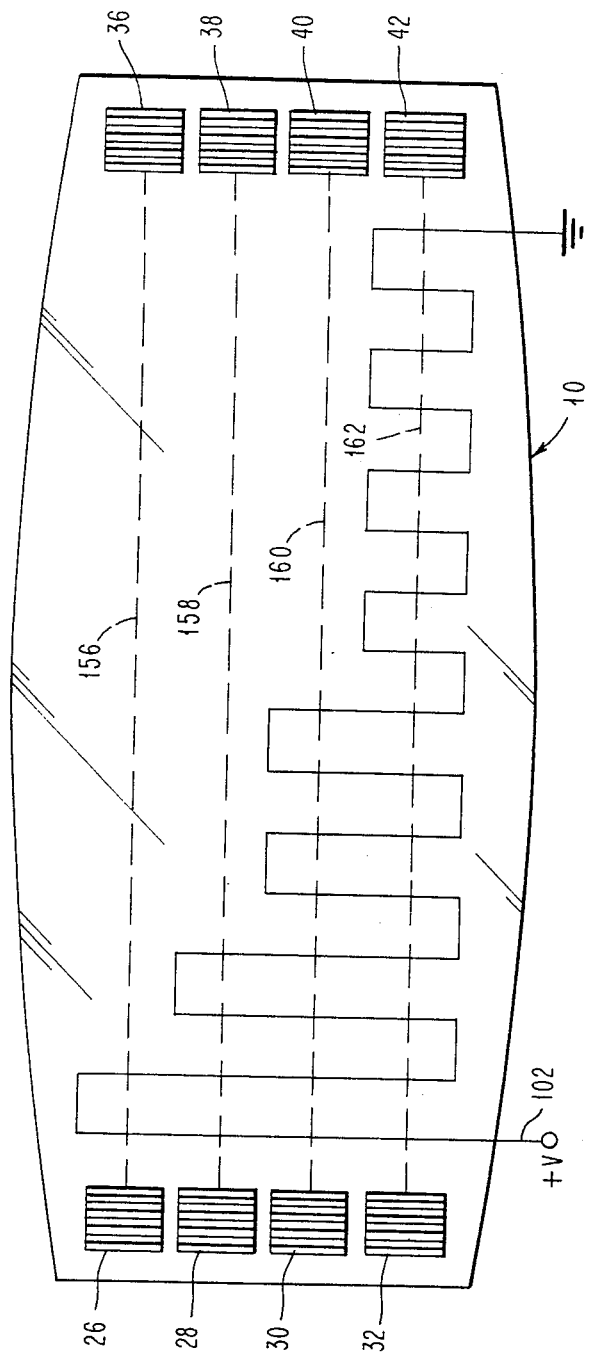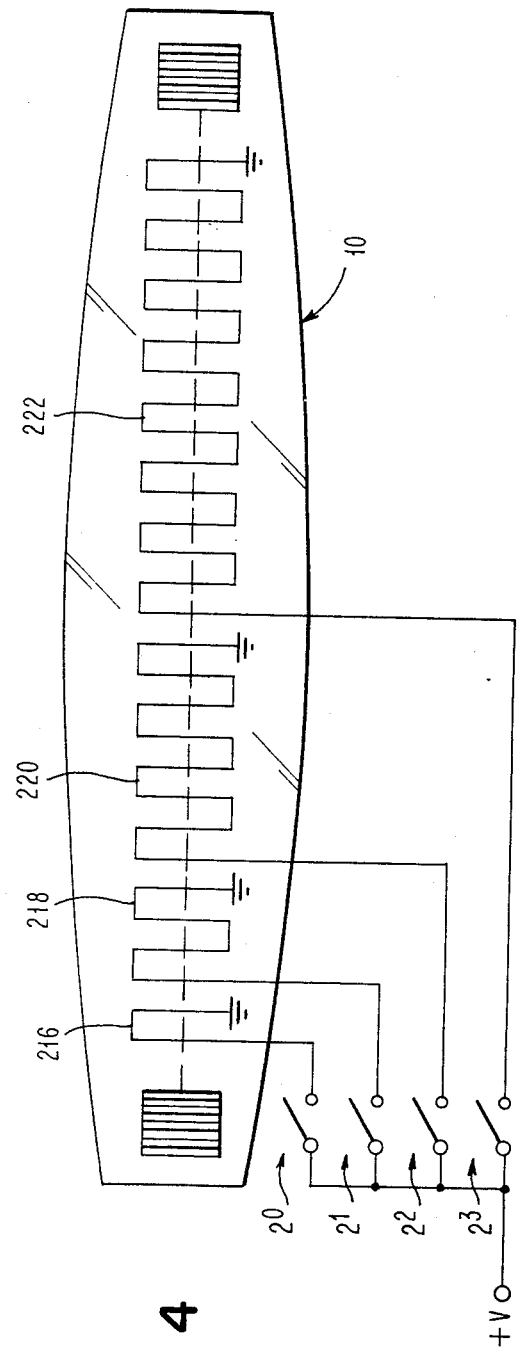

OPTICAL DIGITAL TO ANALOG CONVERTER

FIELD OF INVENTION

This invention relates to optical systems, and more particularly, to light control by altering the property of propagation of an optical medium.

DESCRIPTION OF THE PRIOR ART

Mode conversion through use of periodic magnetic fields has been described in articles in Applied Physics Letters by Tien et al, Appl. Phys. Lett., Vol. 21. No. 8, p. 394 (1972) and by Tseng et al, Appl. Phys. Lett. Vol. 24, No. 6, p. 265. Both of these articles describe experiments for enhancing the conversion of light from the TE to the TM mode through application of a periodic magnetic field to a magneto-optic thin film waveguide. The former utilizes a serpentine current carrying deposited conductor to achieve the periodic magnetic field. The latter uses spaced pads of deposited permalloy to achieve the fields.

The authors of these publications, while primarily concerned with the phenomenon, contemplated exploiting it as a means for modulating the light. This necessarily connotes control over the presence or absence of the magnetic field or over its intensity.

The instant invention exploits the phenomenon described by these authors and utilizes apparatus such as they describe as an element in a combination of elements to provide a digital to analog converter. In a first embodiment, a plurality of optical input signals are converted directly to an optical analog signal output. In a second embodiment, a plurality of digital electrical signals are converted to an optical analog output.

SUMMARY OF THE INVENTION

It is therefore an object of this invention to provide a digital to analog converter for converting combinations of digital input signals to an optical output signal which is the analog of the digital input.

It is a further object to provide a digital to analog converter wherein the digital input signals are in the form of the presence or absence of a discrete light signal for each digital input.

It is yet another object to provide a digital to analog converter in accordance with the first object wherein the input signals are electrical signals, which by their respective presence or absence manifest the respective digital signals.

It is a further object to provide an optical digital to analog converter employing a thin film optical waveguide fabricated of a magneto optical material having means in the path of light propagation therethrough for producing in the film a plurality of magnetic field reversals equal to the weight of the digital values to be converted, whereby the mode conversion of the propagating light beam produces an optical analog proportional to the sum of the digital values.

The foregoing and other objects, features, and advantages of the invention will be apparent from the following more particular description of preferred embodiment as illustrated in the accompanying drawings of which;

FIG. 3 is an optical to optical D/A converter employing a serpentine current conductor;

FIG. 4 is an electrical to optical D/A converter.

THEORY OF OPERATION

Figure 1:
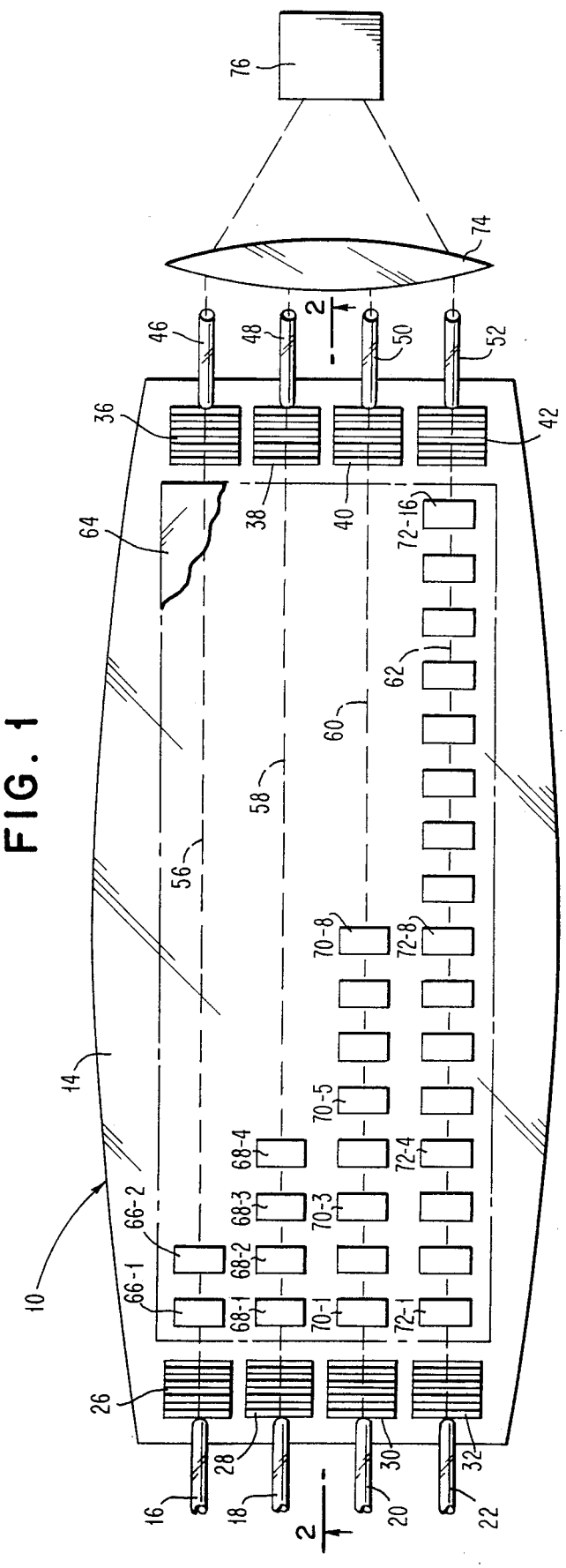
FIG. 1 illustrates an optical to optical D/A converter employing magnetic islands.

As discussed in the papers supra, the efficiency of the mode conversion process in magneto-optic thin-film waveguides grown on isotropic substrates is limited typically to a few percent because of the mismatch between the phase velocities of the TE and TM modes. Those papers described how this limitation could be overcome by applying a periodically reversing magnetic field to the magneto-optic film along the direction of propagation.

In a magneto-optical waveguide in which the magnetization is either longitudinal to the direction of light propagation or normal to both the film and the light beam, let $\beta^{TM}$ and $\beta^{TE}$ be respectively the propagation constants of the TM mode and the TE mode. Then for a propagation length of $$l = \frac{\pi}{(\beta^{TM}-\beta^{TE})}$$

the input and the output at the guide is related by:
$$E^{TM}(l) = -i \cos x\, E^{TM}(0) - \sin x\, E^{TE}(0) = E^{TE}(l)\sin x - i\cos x\, E^{TE}(0)$$

where $$x = \frac{2k}{(\beta^{TM}-\beta^{TE})}$$

$k$ is the coupling strength and its sign depends on the direction of magnetization.

If the input is assumed to be purely a TM mode, viz., $E^{TM}(0) \neq 0$, $E^{TE}(0) = 0$, then the converted TE mode at the output will be:
$$E^{TE}(l) = E^{TM}(0) \sin x.$$

If the direction of magnetization is reversed, the sin $x$ in the matrix operator will change sign.

If the light beam propagates through two sections each of a distance $l$, and the directions of magnetization in the two sections are reversed with respect to one another, the relationship between the output and input is $$E^{TM}(l^+, l^-) = -i \cos x -\sin x -i \cos x \sin x\, E^{TM}(0) = E^{TE}(l^+, l^-)\sin x\, i\cos x -\sin x\, i\cos x\, E^{TE}(0) -i\cos 2x -i\sin 2x\, E^{TM}(0) = -i\sin 2x -\cos 2x\, E^{TE}(0)$$

If, as assumed, the input is purely the TM mode, then the converted TE mode at the output will be:
$$E^{TE}(l^+, l^-) = -i\, E^{TM}(0) \sin 2x$$

The amplitude of the output TE mode will thus be doubled after traversing two sections of $l$ length as compared with one section.

As the light propagates through each additional segment of $l$ length with alternately reversed fields, the intensity of the TE mode will undergo an additional doubling in each successive stage.

In one embodiment, a plurality of parallel channels selectively receive light inputs in accordance as the presence or absence of the corresponding bit of the binary number. Each channel has double the number of individual mode converters of the preceding lower channel. Thus, for a given intensity of light into each of the channels, each produces a converted mode light output in the ratio: 1, 2, 4, 8, etc.

The first embodiment has two subordinate embodiments, each of which generates the periodic magnetic field by different structures. In one, the fields are generated by pads of permalloy. In the second, the fields are produced by a continuous serpentine conductor wherein the number of turns ineach of the channels is related to the binary series. Both embodiments gate the light inputs to the respective channels to manifest the coded digital value and add the outputs of the channels as the analog sum of the channels.

In the second embodiment, the digital inputs are electrical signals which selectively energize the serpentine windings to produce the mode multiplication. The mode converters are cascaded into a single channel so that the summation process is achieved in the single channel.

DETAILED DESCRIPTION OF THE DRAWINGS

Figure 2:
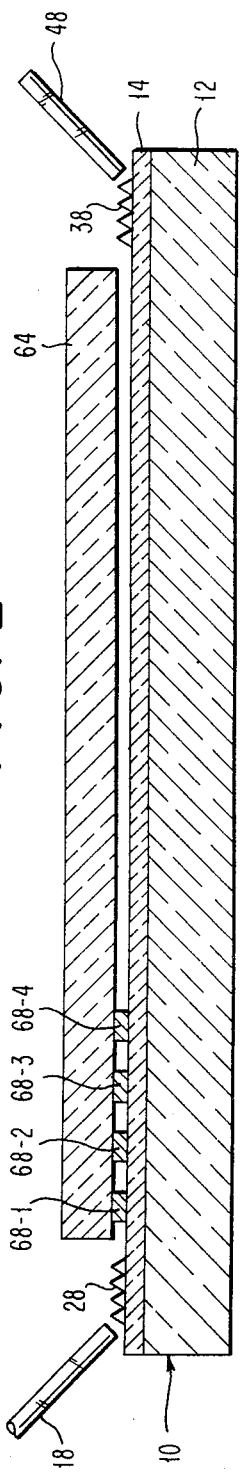
FIG. 2 is a sectional view of FIG. 1.

Referring to FIGS. 1 and 2, which show the first of the optical to optical converters, the wafer 10 consists of a nonmagnetic garnet substrate 12 of GGG material and an index of refraction of 2.197. The thin film waveguide 14 is grown by liquid phase epitaxial deposition on the chemically polished substrate. The film, having the formula $(Gd_{0.5}Y_{2.5})(Fe_4Ga_1)O_{12}$, has a thickness between 6 and 8 $\mu$m, an index of refraction of 2.1 and a magnetic orientation in the plane of the film parallel to the direction of light propagation.

Light is coupled into the thin film by means of individual light pipes, of which four, 16, 18, 20, and 22 are illustrated and coupling gratings 26, 28, 30 and 32, respectively. The gratings have a period of 1.2 $\mu$m and are fabricated on the surface of the thin film 14.

Corresponding output couplers, consisting of gratings 36, 38, 40, and 42 and light pipes 46, 48, 50, and 52 provide four thin film waveguide channels 56, 58, 60, and 62 in the common thin film 14 between the corresponding input and output gratings. Channel one is bounded by gratings 26 and 36, channel two by 28 and 38, etc.

The 1.5 $\mu$m output of He-Ne laser is selectively coupled to the light pipes 16, 18, 20 and 22 to represent the coded inputs $2^0$, $2^1$, $2^2$, or $2^3$, respectively. For these four illustrative inputs, there are $2^4$ or 16 combinations ranging from the absence of all inputs (0000) to the presence of all inputs (1111). Only the TM mode of the laser is coupled to the input grating.

Absent any field reversals in the channels, substantially all of the light at the end of the channels would maintain the TM mode with a very small TE component. To obtain the conversion in accordance with the powers of two, a periodically reversing magnetic field is applied to the thin film. This is achieved by providing a plurality of magnetic islands in each of the channels.

As best shown in FIG. 2, a sapphire wafer 64 has a permalloy film approximately 3,500 A thick sputtered thereon. This film is photolithographically etched to provide a periodic array of permanent magnet islands 68-1, 68-2, 68-3, 68-4 in FIG. 2. Each of these islands has the dimensions of 18 mils in the direction of propagation and 36 mils transverse thereto. The periodicity of the islands is 36 mils so that the void between them is 18 mils. The magnetic poles of each island are aligned parallel to the channels. The sapphire wafer 64 with its magnetic islands of permalloy is gently clamped with the magnets in contact with the iron garnet thin film waveguide. Alternatively, the permalloy pads may be deposited directly on the waveguide.

The islands shown dotted in FIG. 1 include islands 66-1 and 66-2 in the $2^0$ channel, 68-1, 68-2, 68-3, 68-4 in the $2^1$ channel, 70-1 through 70-8 in the $2^2$ channel and 72-1 through 72-16 in the $2^3$ channel. Succeeding channels would contain double the number of pairs of islands.

The $2^0$ channel produces 1 increment of TE output. Each succeeding channel produces 2, 4, and 8 increments of output if input light is incident upon the channel. The output gratings 26, 38, 40, and 42 collect the light from each channel and feed the optical fibers 46, 48, 50 and 52, respectively. The lens 74 collects and sums the respective optical fiber outputs and directs the summed outputs to a utilization device 76.

The $2^0$ channel 56 has a TE mode output as follows:
$$E_1^{TE} = E^{TM}(0) \sin 2x \simeq E^{TM}(0)(2x) \propto x \quad (1)$$
The $2^1$ channel 58 has an output:
$$E_2^{TE} = E^{TM}(0) \sin 4x \simeq E^{TM}(0)(4x) \propto 2x \quad (2)$$
Channels 3 (60) and 4 (62) have the following outputs:
$$E_3^{TE} = E^{TM}(0) \sin 8x \simeq E^{TM}(0)(8x) \propto 4x \quad (3)$$
$$E_4^{TE} = E^{TM}(0) \sin 16x \simeq E^{TM}(0)(16x) \propto 8x. \quad (4)$$

While both the TM and TE modes appear at the ends of the waveguide channels, only the TE mode is coupled out. An analyzer or a conductive film deposited near the output coupler will pass the TE mode to the exclusion of the TM mode. Thus, the TE mode outputs of the respective channels will be $x$, $2x$, $4x$, or $8x$. When summed, they will produce an analog from 0 to $15x$ in increments of $x$.

A second sub-embodiment is shown in FIG. 3. Here, as taught by Tien et al, supra, a serpentine current carrying conductor 102 is held in intimate contact with the thin film waveguide 112. Input and output couplings are effected by means of optical fibers not shown and gratings. By virtue of the staircase configuration of the conductor, the $2^0$ channel 156 has two windings, channel 158 has four, channel 160 has eight, and the $2^3$ channel 162 has 16 windings. A current in the conductor 102 produces the usual magnetic field surrounding a current carrying conductor. Since the current flows in opposite directions, the current flow and the magnetic field produced thereby are periodically reversed in a manner analgous to the magnetic islands of FIGS. 1 and 2. Thus, the TM mode inputed into each channel will produce $x$, $2x$, $4x$, or $8x$ of TE mode at the output. When summed as described with respect to FIGS. 1 and 2, the output will be the analog of the digital inputs.

In the second and final embodiment, shown in FIG. 4, the same substrate thin film waveguide and input and output couplers as used in the previous embodiments are employed. Instead of parallel channels, only a single channel is employed which seriately passes individual windings 216, 218, 220, and 222. Winding 216 consists of a single conductor passing twice through the channel. Channel 218 has four effective turns in the channel, while 220 has eight, and 222 has sixteen. The spacing between the turns preserves the 36 mils period of the prior apparatus so that the field reversals are maintained. Each of the windings 216, 218, 220, or 222 is selectively energized with the same current value to produce identical magnetic fields. Thus, combinatorial electrical input signals will produce an analog TE output proportional to the summation of the energized digital inputs.

In all of the foregoing embodiments, the absolute magnitude of the respective TE outputs is of no moment, provided that the ratio of the outputs is preserved and the output is of sufficient magnitude to be sensed or otherwise utilized. The same concept of D/A converter may also be implemented utilizint electrooptic materials.

While the invention has been particularly shown and described with reference to preferred embodiments, it will be understood by those skilled in the art that various changes in form and detail may be made therein without departing from the spirit of the invention.

What is claimed is:

1. A digital to analog converter for producing an analog optical output proportional to the summation of the weighted digital values of an encoded digital signal, comprising:

a plurality of thin-film optical waveguide segments, one for each element of the digital code, operative to convert light entered thereinto from a first to a second mode and to produce as an output therefrom of both said modes, the said segments being fabricated from a magneto-optic material;

magnetic field producing means coacting with each of said segments to produce in the magnetic waveguide material thereof a periodically reversing magnetic field, whereby said periodic field in said magneto-optic material converts a portion of one mode of light to a second mode as a function of the number of field reversals, the number of said means for producing the field reversals in each segment being proportional to the weighted digital value of the codal element associated with the segment;

means responsive to a digital code element input for rendering each said segment effective to convert the light from said first mode to said second mode, and means for obtaining the summation of the second mode light outputs from all of said segments, whereby the summation manifests the analog of the digital inputs.

2. The D/A converter of claim 1 wherein said segments are serially disposed;

said field producing means comprises a plurality of discrete current carrying conductors coacting with each respective segment, the first segment having N turns in its conductor, and each succeeding segment having twice the number of turns in its respective conductor as the preceding segment;

the means responsive to the digital code for rendering each segment operative comprises switching means for selectively applying magnetizing current to the respective conductors; and means for obtaining the summation of the second mode outputs from each segment comprises means in each waveguide segment for passing any second mode input, and means, if said segment is activated, for converting a portion of said first mode to said second mode and passing the combined second mode and the unconverted portion of said first mode to a subsequent utilization device, the intensity of said second mode being proportional to the summation of the digital values of all activated segments.

3. The D/A converter of claim 1, wherein said waveguide segments are arranged in a plurality of parallel optical channels;

the means for manifesting the digital code comprises the presence or absence of individual light input signals of said first mode coupled to the respective waveguide segment, and said means for obtaining the summation of the light outputs from each segment comprises light gathering means for collecting the outputs and concentrating them into a single beam.

4. The D/A converter of claim 3, wherein said field producing means comprises a plurality of spaced pads of magnetized material, there being N pads in the low order digital segment, and twice the number of pads in each succeeding segment as in the preceding segment.

5. The D/A converter of claim 3, wherein said field producing means comprises a serpentine current carrying conductor traversing all of said segments, the first segment having N turns of said conductor in coactive engagement therewith, and each succeeding segment having twice the number of turns of said conductor as in the preceding segment.

* * * * *